United States Patent
Hao et al.

(10) Patent No.: US 6,536,777 B2
(45) Date of Patent: *Mar. 25, 2003

(54) SEALING TECHNIQUES SUITABLE FOR DIFFERENT GEOMETRIES AND CONSTRAINED SPACES

(75) Inventors: Fangli J. Hao, Cupertino, CA (US); Eric H. Lenz, San Jose, CA (US); Keith E. Dawson, Livermore, CA (US)

(73) Assignee: Lam Research Corporation, Fremont, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/283,827

(22) Filed: Mar. 31, 1999

(65) Prior Publication Data

US 2001/0045706 A1 Nov. 29, 2001

(51) Int. Cl.[7] .......................... F16L 21/05; F16L 55/00
(52) U.S. Cl. .................... 277/603; 277/608; 277/630; 277/641; 277/913; 285/148.22; 156/345
(58) Field of Search .................. 277/608, 613, 277/628, 630, 637, 636, 641, 642, 644, 650, 913, 946, 603; 156/345, 345 P; 285/148.27, 148.22, 148.23

(56) References Cited

U.S. PATENT DOCUMENTS

| 1,901,897 A | * | 3/1933 | Clayton |
| 3,076,669 A | * | 2/1963 | Schlein |
| 3,428,340 A | * | 2/1969 | Pelton |
| 3,612,545 A | * | 10/1971 | Storms ..................... 277/162 |
| 3,652,183 A | * | 3/1972 | Pottharst, Jr. |
| 3,667,788 A | * | 6/1972 | Greenwood |
| 3,909,014 A | | 9/1975 | Loliger |
| 3,925,139 A | | 12/1975 | Simmons |
| 3,942,826 A | * | 3/1976 | Lester |
| 3,976,341 A | | 8/1976 | Colley |
| 4,006,282 A | | 2/1977 | Antoine |
| 4,061,345 A | | 12/1977 | Lund |
| 4,068,852 A | | 1/1978 | Anglade |
| 4,147,382 A | * | 4/1979 | Wachter |
| 4,265,458 A | | 5/1981 | Wheeler |

(List continued on next page.)

FOREIGN PATENT DOCUMENTS

| DE | 3810979 A | 10/1989 |
| EP | 0837278 A | 4/1998 |
| JP | 05221776 A | 8/1993 |
| WO | WO9621120 A | 7/1996 |

OTHER PUBLICATIONS

International Search Report (PCT), mailed Jul. 31, 2000, Int'l Appl. No. PCT/US00/08829.

*Primary Examiner*—Anthony Knight
*Assistant Examiner*—Vismal Patel
(74) *Attorney, Agent, or Firm*—Beyer Weaver & Thomas, LLP (57) ABSTRACT

The invention relates to a fluid connector for sealing an interface between first and second fluid passages in a plasma processing apparatus. The fluid connector includes a first end member having a first geometry. The first geometry is arranged to substantially seal a first mating region of the first fluid passage. The fluid connector further includes a second end member having a second geometry. The second geometry is arranged to substantially seal a second mating region of the second fluid passage and the second geometry is configured differently than the first geometry. The fluid connector additionally includes an opening that extends through the first end member and the second end member through which a fluid may pass for use by the, semiconductor processing apparatus so as to fluidly couple the first fluid passage to the second fluid passage.

52 Claims, 9 Drawing Sheets

U.S. PATENT DOCUMENTS

| | | | |
|---|---|---|---|
| 4,327,924 A | | 5/1982 | Wheeler |
| 4,378,123 A | | 3/1983 | Largent et al. |
| 4,623,028 A | | 11/1986 | Murdoch et al. |
| 4,662,658 A | | 5/1987 | Holowach et al. |
| 4,741,541 A | | 5/1988 | Franken |
| 4,828,273 A | * | 5/1989 | Schadler |
| 4,915,423 A | * | 4/1990 | Wallace |
| 4,991,882 A | * | 2/1991 | Gahwiler |
| 5,048,847 A | * | 9/1991 | Kovacs et al. |
| 5,072,697 A | * | 12/1991 | Sputhe |
| 5,096,209 A | | 3/1992 | Ross |
| 5,098,315 A | | 3/1992 | Scowen |
| 5,259,407 A | | 11/1993 | Tuchida et al. |
| 5,341,567 A | | 8/1994 | Grenci et al. |
| 5,413,358 A | | 5/1995 | Austin, Jr. et al. |
| 5,513,859 A | * | 5/1996 | Huber et al. ............ 277/207 |
| 5,516,122 A | * | 5/1996 | Caffee |
| 5,516,154 A | | 5/1996 | Grenci et al. |
| 5,551,706 A | * | 9/1996 | Barna et al. ............ 277/229 |
| 5,596,851 A | | 1/1997 | Ting |
| 5,599,397 A | | 2/1997 | Anderson et al. |
| 5,633,502 A | * | 5/1997 | Fischione |
| 5,643,026 A | * | 7/1997 | Pietsch et al. |
| 5,655,645 A | | 8/1997 | Foster |
| 5,683,235 A | * | 11/1997 | Welch ............ 277/178 |
| 5,709,018 A | | 1/1998 | Dugan |
| 5,738,358 A | | 4/1998 | Kalsi et al. |
| 5,743,759 A | | 4/1998 | Pudims et al. |
| 5,755,560 A | | 5/1998 | Yumoto |
| 5,836,286 A | * | 11/1998 | Timmer et al. |
| 5,842,701 A | | 12/1998 | Cawthorne et al. |
| 5,855,472 A | | 1/1999 | Ravitts |
| 6,024,363 A | * | 2/2000 | Johnson, Jr. |
| 6,193,284 B1 | * | 2/2001 | King |

* cited by examiner

SEALING TECHNIQUES SUITABLE FOR DIFFERENT GEOMETRIES AND CONSTRAINED SPACES

BACKGROUND OF THE INVENTION

1. Field of the Invention

The present invention relates to sealing techniques for fluid passages and, more particularly, to sealing techniques for use in apparatuses that fabricate semiconductor integrated circuits (ICs).

2. Description of the Related Art

During the manufacture of a semiconductor-based product, for example, a flat panel display or an integrated circuit, multiple deposition and/or etching steps may be employed. By way of example, one method of etching is plasma etching. In plasma etching, a plasma is formed from the ionization and dissociation of process gases. The positively charged ions are accelerated towards the substrate where they drive the etching reactions. Typically, during the etching process, the plasma environment inside the plasma processing apparatus, is held at very low pressures (e.g., 5–30 mTorr). If the pressure is not maintained at an appropriate level during the processing of the substrate, then undesirable and/or unpredictable etch results may be produced. For example, if the pressure is too low, then the electrons inside the plasma have long mean free paths and may not collide with enough molecules before the electrons are lost to the chamber wall thereby adversely impacting the plasma that drives the etching reactions.

For this reason, a manometer is used to measure the pressure. Typically, a manometer is coupled through a series of connections to a process chamber in a plasma processing apparatus. The readings of the manometer give computer the ability to make adjustments to ensure that the pressure inside the process chamber is correct for a particular processing step. Unfortunately, the series of connections that couple the manometer to the process chamber may have leaks. Leaks in the measuring pathway create false measurements and inaccurate readings at the manometer that lead to adverse processing results. The minimum drift in pressure should be less than 5 mTorr. However, in some instances, the loss due to leaks may be in the range of 20 mTorr of flow.

Figure 1A:
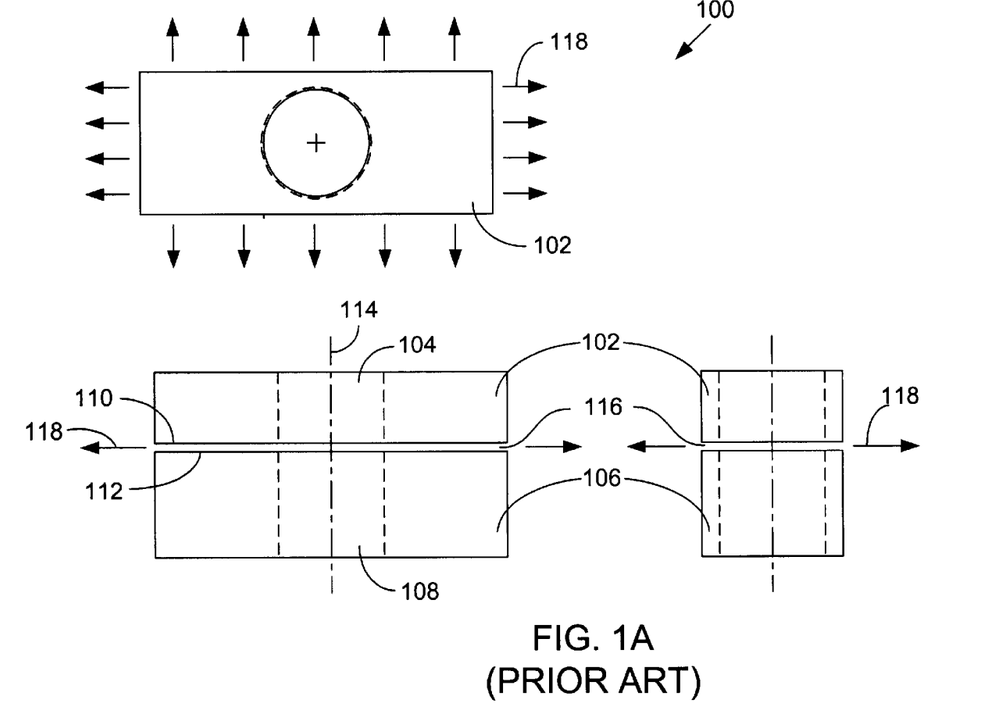
FIGS. 1A–1B depict an exemplary conventional layer assembly with a leaking problem.
Figure 1B:
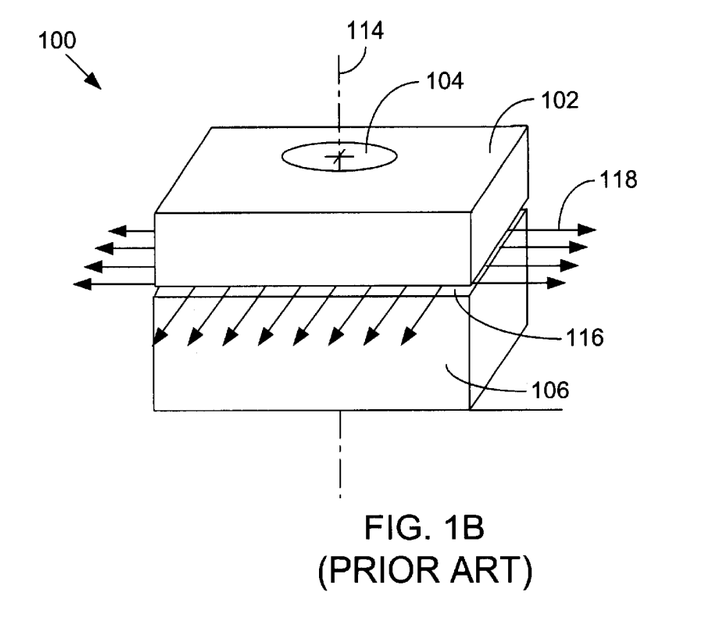

To facilitate discussion of this leakage problem, FIG. 1A and 1B illustrate a typical layer assembly 100 that has a leak. FIG. 1A shows a front, side and top view of the layer assembly 100, and FIG. 1B shows a perspective view of the layer assembly 100. Layer assembly 100 includes a first layer 102 having a first cylindrical passage 104 and a second layer 106 having a second cylindrical passage 108. Typically, first layer 102 includes a surface 110 that is in contact with a surface 112 of second layer 106. Each layer represents a different piece of equipment found in a typical plasma processing apparatus (e.g., quartz ring, focus ring, etc.). Additionally, the passages are used to couple the process chamber (not shown) with the manometer (not shown). In order to allow the transfer of fluid for measuring, first cylindrical passage 104 and second cylindrical passage 108 must substantially align along an axis 114. However, even if they are aligned properly, the adjacent surfaces of the layers will form a gap 116 at their interface because of unequal surfaces caused by a plurality of finishing techniques (e.g., different finishing process, different material, scratches, etc.). Gap 116 allows the passage of fluid and therefore creates unwanted fluid leaks 118.

Figure 2A:
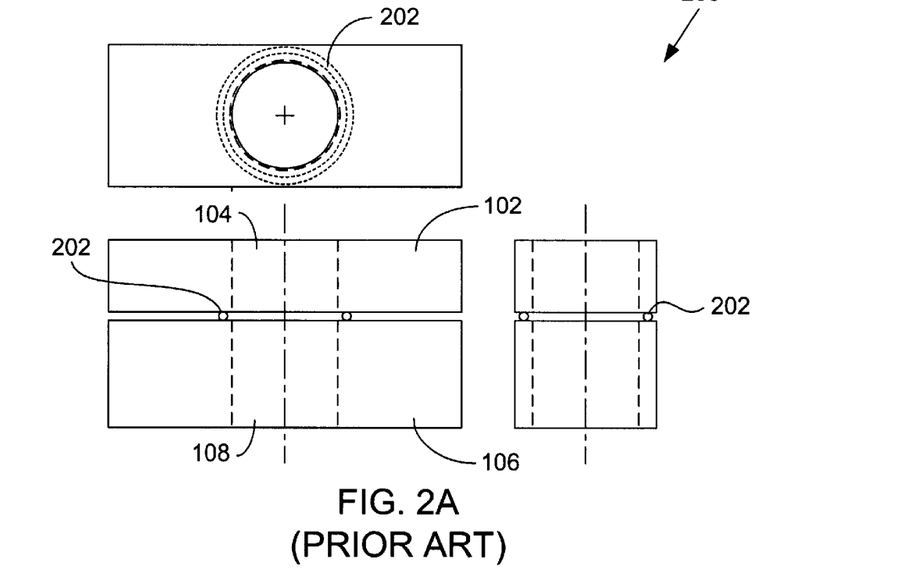
FIGS. 2A–2B illustrate an exemplary conventional layer assembly that uses an o-ring to seal two connecting fluid passages.
Figure 2B:
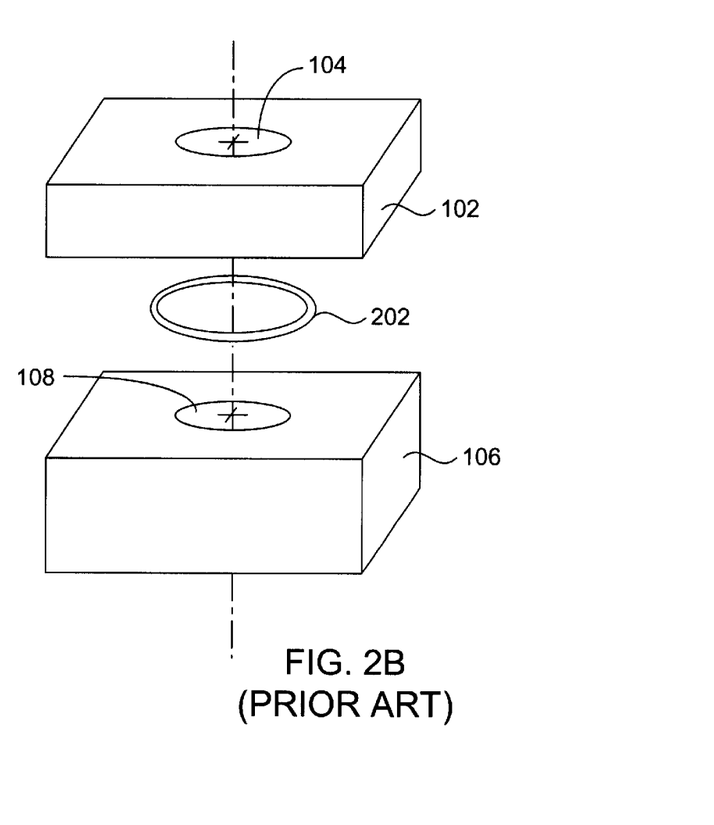

For the most part, conventional o-rings may be used to reduce the leaks created by gap 116. The o-ring seals the interface between the first cylindrical passage 104 and the second cylindrical passage 108 thereby reducing the leaking fluid. To elaborate further, FIG. 2 includes a layer assembly 200. The layer assembly 200 is generally constructed the same as the layer assembly 100 but further includes an o-ring 202. O-ring 202 is disposed in between first layer 102 and second layer 106 and surrounds the perimeter of first cylindrical passage 104 and second cylindrical passage 108. The o-ring 202 serves to prevent a fluid from leaking out of the interface of first cylindrical passage 104 and second cylindrical passage 108.

It would be preferable to design interfaces that are the same shape, especially circular shapes where conventional o-rings may be used. However, recent technology has required increasingly complicated fluid passages that are constrained by limited space. For example, if one fluid passage is square-shaped and the other is circle-shaped, a standard o-ring may not be able to seal the interconnection of the different shaped fluid passages. Further, when the width of the layer around the fluid passage is narrow, there may not be enough room to place an o-ring.

Figure 3A:
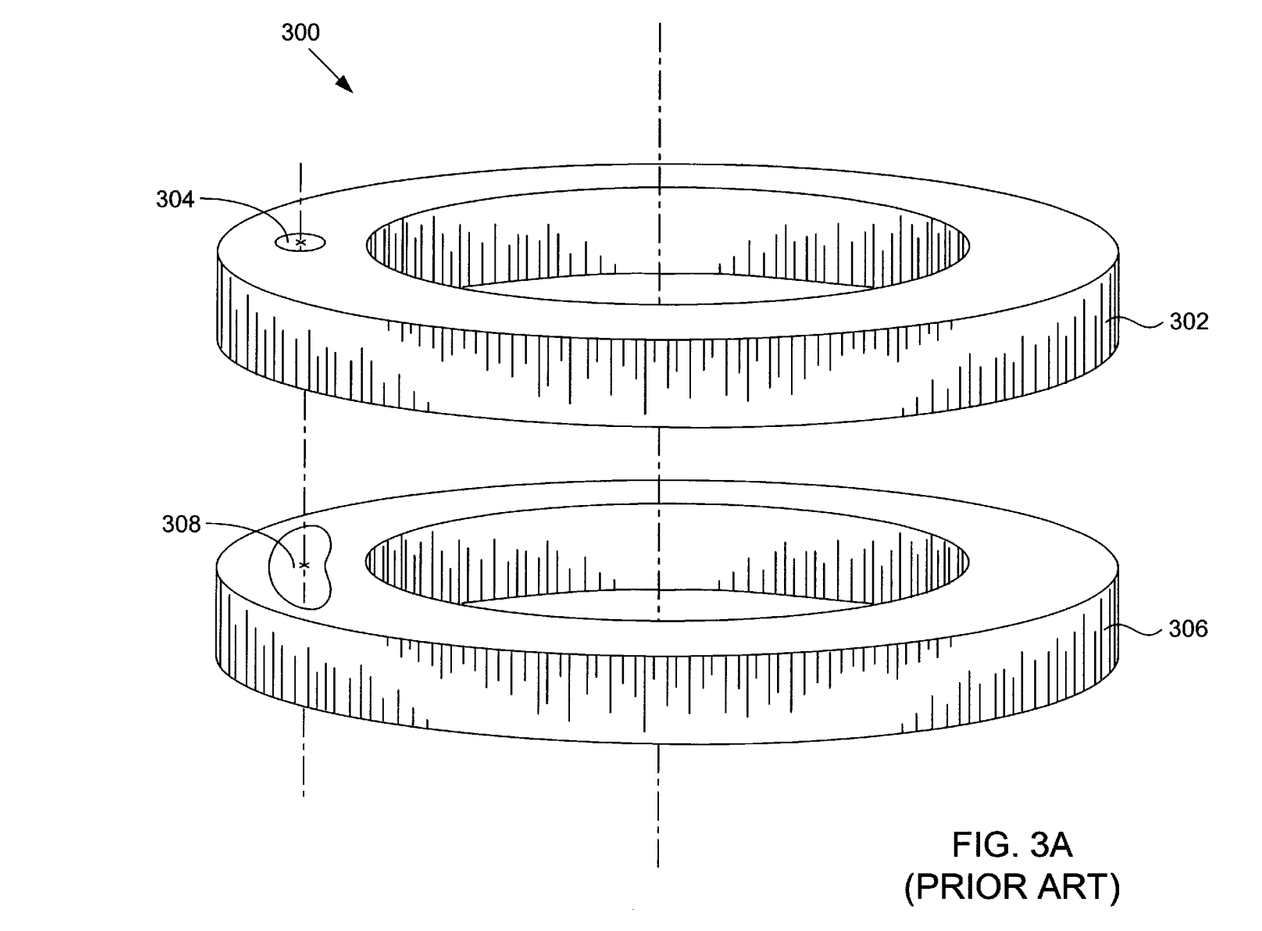
FIGS. 3A–3C illustrate an exemplary layer assembly that includes fluid passages with complicated shapes.
Figure 3B:
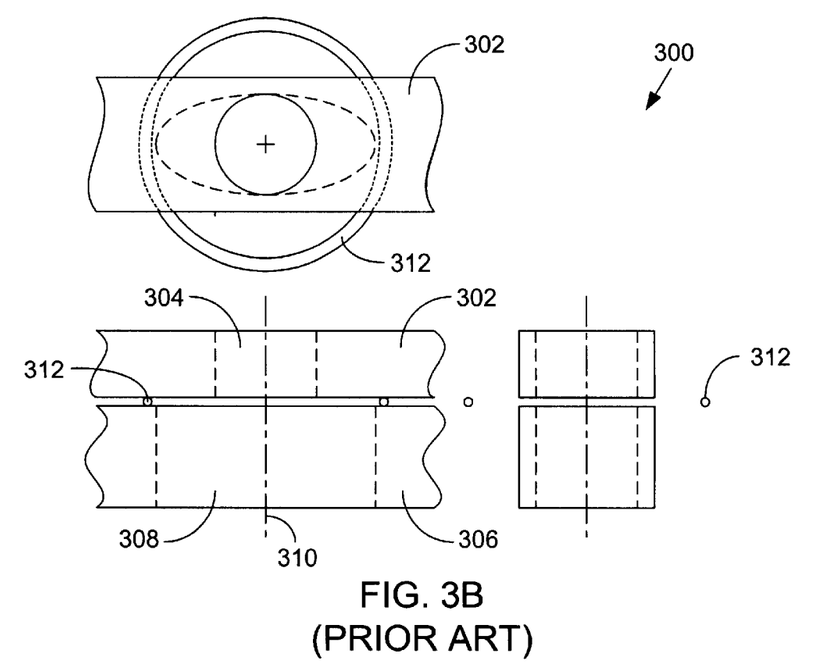
Figure 3C:
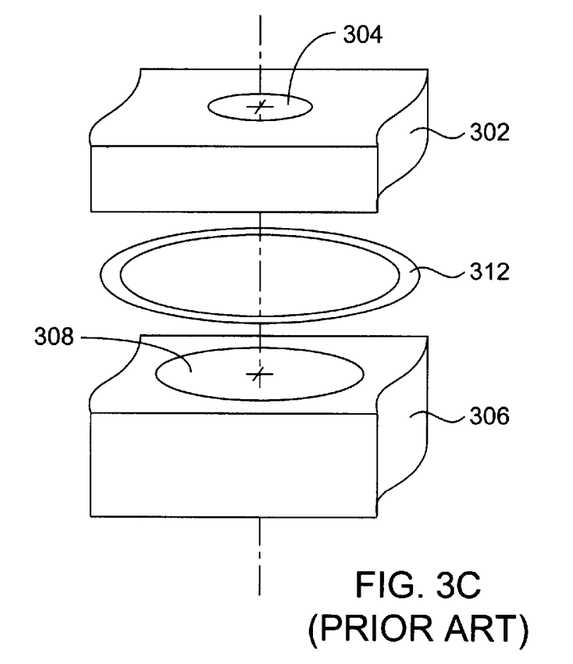

By way of example, FIGS. 3A–3C illustrate a layer assembly 300 with fluid passages that have different shapes. FIG. 3A depicts an exemplary situation where two layers with complicated fluid passages and limited space are coupled together. As shown, the layer width is constrained by the inside diameter and the outside diameter of the interfacing layers. In addition, FIG. 3B shows a front view, side view and top view of a section in layer assembly 300 that includes the fluid passages of the two layers shown in FIG. 3A.

Layer assembly 300 includes a first stack layer 302 having first a fluid passage 304 and a second layer 306 having a second fluid passage 308. First fluid passage 304 is a passage having a circular shape (cylindrical passage). Second fluid passage 308 is a passage having an irregular shape (e.g., oval, rectangle, square, triangle, polygon, etc.). As shown in FIG. 3B, first fluid passage 304 and second fluid passage 308 cannot properly align about an axis 310 because of their different geometries. As a result, the interface between first fluid passage 304 and second fluid passage 308 will tend to leak. If o-ring 312 is used between the interfacing layers, then part of o-ring 312 will be disposed outside the limited width of the two interfacing layers. Therefore, the gaps at the interface will not be sealed and fluid leaks will ensue. As noted above, in the case of plasma processing apparatuses, such leaks lead to unwanted processing results due to inaccurate manometer pressure readings.

In view of the foregoing, there is a need for improved techniques for sealing two adjacent fluid passages that are constrained by different shapes and limited space.

SUMMARY OF THE INVENTION

The invention relates, in one embodiment, to a fluid connector for sealing an interface between first and second fluid passages in a plasma processing apparatus. The fluid connector includes a first end member having a first geometry. The first geometry is arranged to substantially seal a first mating region of the first fluid passage. The fluid connector further includes a second end member having a second geometry. The second geometry is arranged to substantially seal a second mating region of the second fluid passage. The second geometry is configured differently than the first geometry. The fluid connector additionally includes an opening that extends through the first end member and the second end member through which a fluid may pass for use by the semiconductor processing apparatus so as to fluidly couple the first fluid passage to the second fluid passage.

The invention relates, in another embodiment, to a system for sealing an interface between at least two fluid passages. The system includes a first surface having a first fluid passage with a first geometry. The system further includes a second surface having a second fluid passage with a second geometry. The second geometry is different from the first geometry of the first fluid passage. The system additionally includes a connector for sealing the first fluid passage with the second fluid passage. The connector has a proximal section and a distal section. The proximal section is configured to at least partially extend into the first fluid passage and has a shape that coincides with the first geometry such that the connector is substantially sealed with respect to the first fluid passage. The distal section is configured to at least partially extend into the second fluid passage and has a shape that coincides with the second geometry such that the connector is substantially sealed with respect to the second fluid passage. Also, the connector includes an opening that provides a sealed fluid passage between the first fluid passage and the second fluid passage.

The invention relates, in yet another embodiment, to a plasma processing apparatus. The plasma processing apparatus includes a chamber associated with a first fluid passage. The plasma processing apparatus further includes a manometer associated with a second fluid passage. The plasma processing apparatus additionally includes an interconnection sealer for sealing an interface between the first fluid passage and the second fluid passage. The interconnection sealer includes a first end member having a first geometry. The first geometry is arranged to substantially seal a first mating region of the first fluid passage. The interconnection sealer further includes a second end member having a second geometry. The second geometry is arranged to substantially seal a second mating region of the second fluid passage. The second geometry is configured differently than the first geometry. The interconnection sealer additionally includes an opening that extends through the first end member and the second end member through which a fluid may pass so as to fluidly couple the first fluid passage to the second fluid passage.

Also, the invention relates, in one embodiment, to a method of sealing fluid passages of different shapes. The method includes identifying a first surface including a first fluid passage having a first geometry. The method further includes identifying a second surface including a second fluid passage having a second geometry. The second geometry is different from the first geometry. The method additionally includes fitting an interconnection sealer for use with the first fluid passage and second fluid passage. The interconnection sealer includes a proximal section and a distal section. The proximal section is configured to at least partially extend into the first fluid passage and has a shape that coincides with the first geometry such that the interconnection sealer is substantially sealed with respect to the first fluid passage. The distal section is configured to at least partially extend into the second fluid passage and has a shape that coincides with the second geometry such that the interconnection sealer is substantially sealed with respect to the second fluid passage. The interconnection sealer further includes an opening that provides a fluid passage. The method further includes inserting the interconnection sealer into the first fluid passage and the second fluid passage and substantially sealing the first fluid passage and the second fluid passage with the interconnection sealer.

DESCRIPTION OF THE DRAWINGS

The present invention is illustrated by way of example, and not by way of limitation, in the figures of the accompanying drawings where like reference numerals refer to similar elements, and in which.

DESCRIPTION OF THE INVENTION

Conventional technology (e.g., using standard o-rings) provides for sealing simple fluid passages that connect between two layers. However, some designs require complicated fluid passage shapes that exceed the limits of conventional o-rings because of the limited space of the two interfacing layers. It has become increasingly challenging to seal such complicated shapes. In fact, such designs have typically left fluid passages unsealed. This leads to an unwanted leakage between the connecting fluid passages. In the case of plasma processing apparatuses, unwanted leakage leads to inaccurate pressure readings at a manometer and thus unsatisfactory processing results. The present invention overcomes these disadvantages.

The present invention provides a fluid connector for sealing the interconnection of two fluid passages with different geometries or shapes. The fluid connector, herein also referred to as an interconnection sealer, has a first end that coincides with the geometry of a first fluid passage and a second end that coincides with the geometry of a second fluid passage. Each end is arranged to substantially seal the interface at the mating surfaces of the end and its associated fluid passage. The fluid connector also includes an opening that fluidly couples the first fluid passage to the second fluid passage.

The present invention will now be described in detail with reference to a few preferred embodiments thereof and as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known items have not been described in detail in order not to unnecessarily obscure the present invention.

Figure 4A:
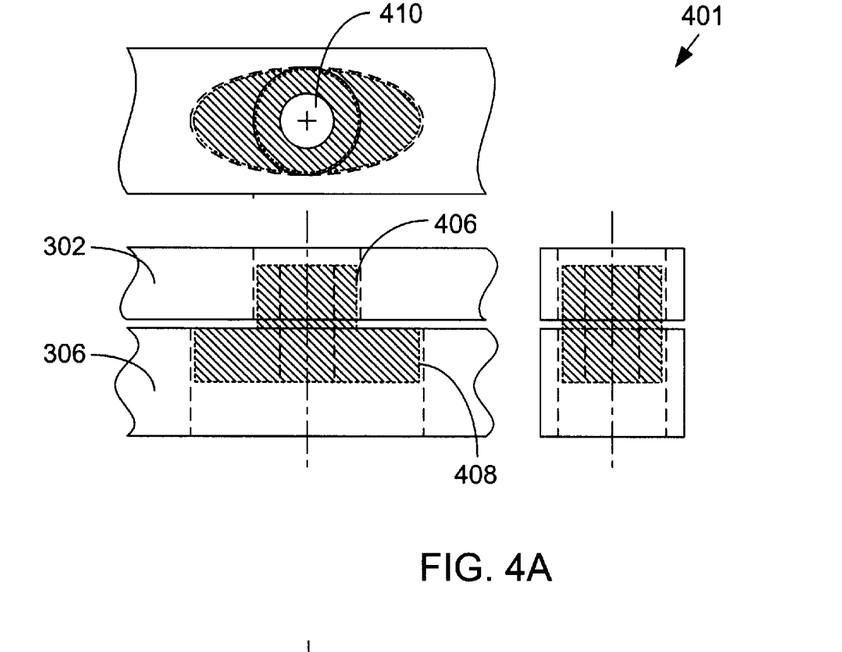
FIG. 4 illustrates, in accordance with one embodiment of the present invention, the interconnection sealer at an interface of a layer stack assembly.
Figure 4B:
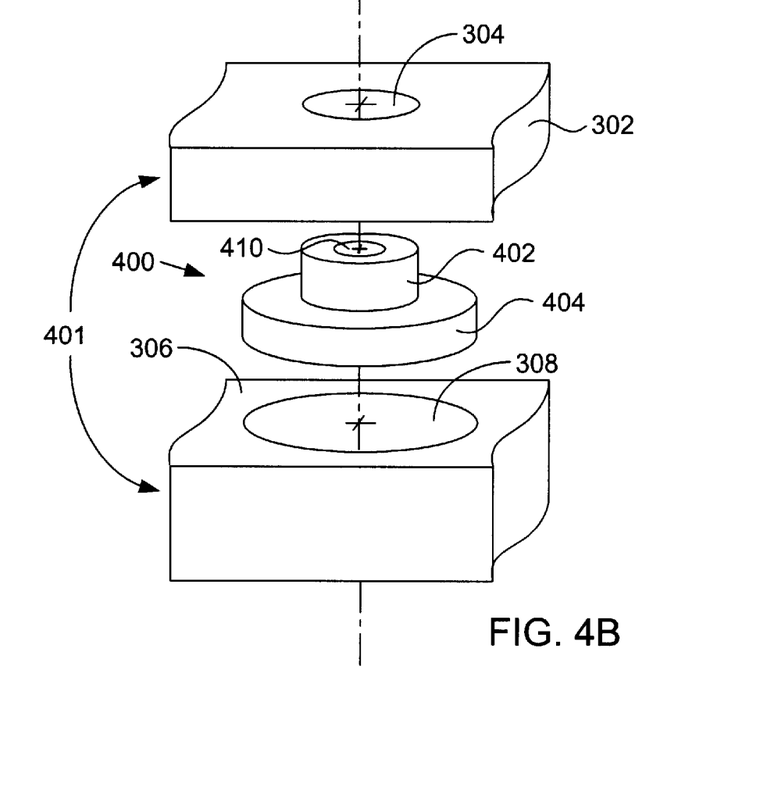

FIGS. 4A and 4B illustrate an interconnection sealer 400 at the interface of layer assembly 401. Like the layer assembly 300 discussed above with respect to FIGS. 3A–3C, layer assembly 401 includes first layer 302 having first fluid passage 304 and second layer 306 having second fluid passage 308. First fluid passage 304 has a first geometry and second fluid passage 308 has a second geometry that is different from the first geometry. Both the first geometry and the second geometry are determined by design constraints of an apparatus desirous of sealing the first fluid passage 304 to the second fluid passage 308, such as a plasma processing apparatus.

Interconnection sealer 400 includes a first end 402 and a second end 404. First end 402 is configured to at least partially extend into first fluid passage 304, and second end 404 is configured to at least partially extend into second fluid passage 308. In order to seal the interface between first end 402 and first fluid passage 304, the outer periphery of first end 402 is formed to substantially fill the inner periphery of first fluid passage 304, thereby creating first mating region 406. In order to seal the interface between second end 404 and second fluid passage 308, the outer periphery of second end 404 is formed to substantially fill the inner periphery of second fluid passage 308, thereby creating second mating region 408. In other words, first end 402 is formed of a shape that coincides with the first geometry of first fluid passage 304 and second end 404 is formed of a shape that coincides with the second geometry of second fluid passage 308. Additionally, interconnection sealer 400 includes opening 410 that extends through first end 402 and second end 404. Opening 410 fluidly couples first fluid passage 304 to second fluid passage 308 so that a fluid may pass from first fluid passage 304 to second fluid passage 308. As is well known in the art, the fluid may be a liquid or gas (i.e., nitrogen, oxygen, argon, C4F8, etc.).

As was noted previously, the second geometry is different than the first geometry. As shown in FIGS. 4A and 4B, the first geometry is a circle and the second geometry is an oval. However, the first and second geometries can take various shapes (or forms) and also differ in a variety of ways. By way of example, the interconnection of two fluid passages may include geometry combinations that include conventional (i.e., circle) and non-conventional (i.e., square, oval, rectangle, triangle, polygon, slot, etc.) shapes. More specifically, the interconnections may include square/circle, circle/oval, oval/rectangle, triangle/circle or circle/slot. Using the square/circle combination as an example, first end 402 will be configured with a first geometry having a square shape and second end 404 will be configured with a second geometry having a circle shape. Any combination above may be used so long as the first fluid passage has a different geometry than the second fluid passage. The geometries of the shapes can also be more complex shapes.

Interconnection sealer 400 can be formed from a material that can substantially seal an interface between the interconnection sealer and the fluid passages. In some implementations, such materials can deform such that the outer periphery of the interconnection sealer fits tightly into the inner periphery of the fluid passage. Additionally, the material should be determined by the parameters involved in the environment it will be used in (e.g., temperature, pressure, type of fluid) to reduce warpage and part degradation.

In one embodiment, interconnection sealer 400 will be used in a plasma processing apparatus, and therefore interconnection sealer 400 should be formed from a material that can substantially withstand a plasma environment and does not substantially contribute to contamination. As examples, interconnection sealer can be formed from polytetraflouroethylene (PTFE), e.g., TEFLON, or polyetheretherketone (PEEK). However, it should be noted that in some instances, soft metals such as Nickel may be a suitable material for interconnection sealer 400. In any case, it should also be noted that the above description is not limiting and any material that can take the shape of an interconnection sealer and substantially seal an interface may be used.

Because of the tolerances involved in lining up first layer 302 and second layer 306 during manufacturing, one end of interconnection sealer 400 may need to be configured with a gap between the outer periphery of that particular end and the inner periphery of the associated fluid passage. The gap will give layer 302, layer 306 and interconnection sealer 400 some play when connecting them together. However, creating a gap at one of the ends may cause an opening that allows a fluid to leak. For that reason, when a gap is needed for lining up the layers, the interconnection sealer 400 may need to be alternatively configured in order to seal the interface.

Interconnection sealer 400 can also be configured to hold a seal device. The addition of a seal device 400 will further seal the interface between the ends of the interconnection sealer 400 and their respective fluid passages. Typically, the interconnection sealer 400 includes a notch (or groove) to hold the seal device. Even if the notch is not created, a seal device may still be provided to create a better seal at critical points in the fluid pathway. Any seal device that is suitable for sealing the associated geometry may be used. One suitable seal device is an elastomer o-ring. However, this is not a limitation and other types.of seal devices (e.g., gaskets, liquid sealants) may be used, so long as they substantially seal the gap.

FIGS. 5A–5E illustrate several embodiments of interconnection sealer in combination with a seal. For ease of discussion, FIGS. 5A–5E are cross sectional side views of layer assembly 401 with a gap 500 between at least one of the fluid passages and the associated end of interconnection sealer 400. As discussed above, layer assembly 401 includes first layer 302 having first fluid passage 304 and second layer 306 having second fluid passage 308. The above discussion for reference number 302–308 applies to FIGS. 5A–5E and therefore the numbers are only shown in FIG. 5A.

Figure 5A:
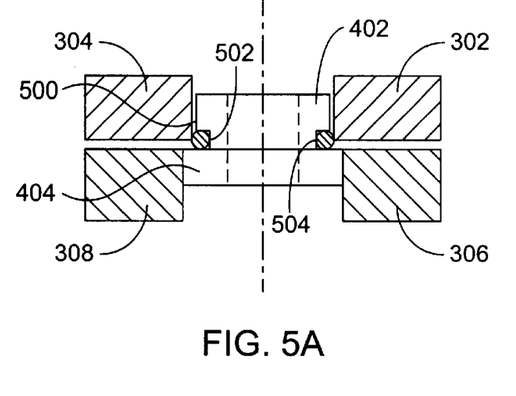
FIGS. 5A–5E illustrate, in accordance with one embodiment of the present invention, several embodiments of an interconnection sealer in combination with a seal.

Referring first to FIG. 5A, interconnection sealer 400 includes a notch 502 disposed in a portion of first end 402. Notch 502 is configured to hold a seal 504. The seal should be configured in such away that it substantially seals gap 500. Preferably, the seal contacts a vertical portion of the first end and a horizontal portion of the second end.

Figure 5B:
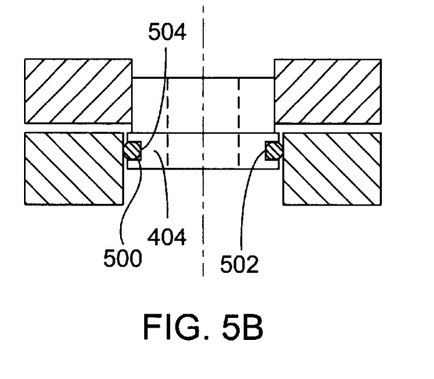

Alternatively, in FIG. 5B, gap 500 is between second end 404 and the inner periphery of second fluid passage 308. Interconnection sealer 400 includes notch 502 disposed in a portion of second end 404. Notch 502 is configured to hold seal 504 and seal 504 is configured to seal gap 500.

Figure 5C:
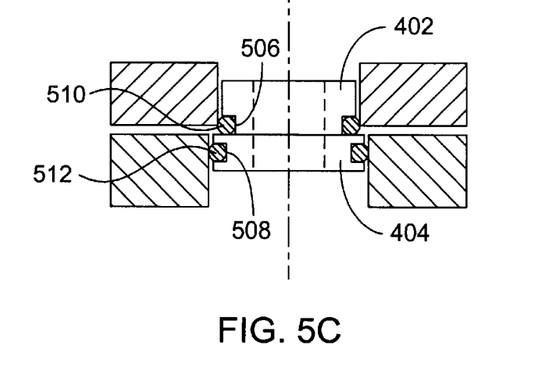

In some instances, a combination of the embodiments shown in FIGS. 5A and 5B are needed to ensure that first layer 302, second layer 306 and interconnection sealer 400 are substantially sealed. For example, this may be useful in cases where more play.or tolerance is needed to properly align and couple the aforementioned layers together. FIG. 5C illustrates such an embodiment. Interconnection sealer 400 includes a first notch 506 disposed in a portion of first end 402 and a second notch 508 disposed in a portion of second end 404. First notch 506 is configured to hold a seal 510 and second notch 508 is configured to hold a seal 512. Seal 510 is configured to substantially seal a gap at the first fluid passage interface and seal 512 is configured to substantially seal a gap at the second fluid passage interface.

Figure 5D:
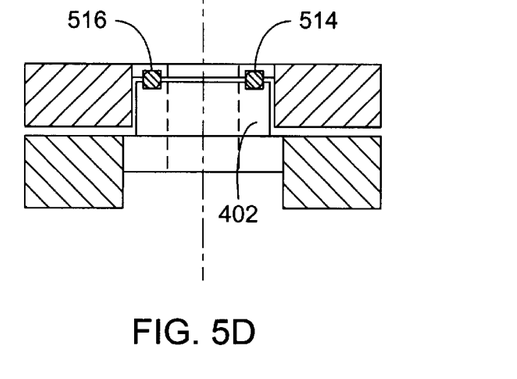

Further, one of the ends of the interconnection sealer 400 may extend into a fluid passage such that the distal face of that particular end abuts to a portion of layer 302 or some other piece of the interconnection layer (i.e., plasma processing apparatus). FIG. 5D illustrates the interconnection sealer 400 with a distal face having a seal. Interconnection sealer 400 includes a notch 514 in a portion of the distal face of first end 402. Notch 514 is configured to hold a seal 516. As shown, seal 515 seals the interface between the distal face of first end 402 and a horizontal member 516 (e.g., stepped portion of the first layer, third layer, etc.).

Figure 5E:
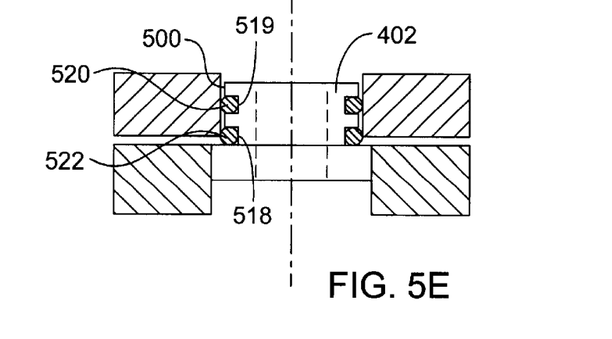

In places that are critical or are under high pressure a multiplicity of seals may be needed. In FIG. 5E illustrates a set of two notches 518 are disposed in a portion of first end 402. Each notch is configured to hold seals 520 and 522. Seals 520 and 522 are configured to substantially seal gap 500. It should be noted that the arrangement in FIG. 5E may be reversed such that the notches are placed on the second end. The notches can also be provided on both the first end and the second end. In summary, it should be borne in mind that the aforementioned arrangements are not limiting and that any combination of notches and seals may be used that are suitable for substantially sealing a gap between the interface of a fluid passage and one or more ends of the interconnection sealer.

During the manufacture of a plasma processing apparatus or other apparatus that includes two interconnected layers that have fluid passages, one of the aforementioned arrangements shown in FIGS. 4A–5E may be used. The first step in determining the appropriate arrangement includes identifying a first fluid passage having a first geometry and a second fluid passage having a second geometry. If the second geometry is different than the first geometry then an interconnection sealer may be used to seal the interface of the two fluid passages. The next step includes fitting the interconnection sealer with the first fluid passage and the second fluid passage such that the interconnection sealer is substantially sealed with respect to the two fluid passages. Typically, during the fitting step the interconnection sealer is inserted into the first fluid passage and then into the second fluid passage thereby coupling the two fluid passages together. If the interconnection sealer of FIGS. 4A–4B is used, each end should fill the inner periphery of the respective fluid passage such that the interface is substantially sealed. Alternatively, only one end of the interconnection sealer should fill the inner periphery as shown in FIGS. 5A–5B and 5D–5E while the other end should have some gap.

In one embodiment, such as shown in FIGS. 4A and 4B, the interconnection sealer is configured to have a first end having a conventional geometry and a second end having a different geometry. More specifically, the first end has a circular shape and the second end has a slot shape. Both the first and second ends are arranged to extend into a portion of their respective fluid passages to substantially seal the interface between the fluid passages and the respective ends. Such an arrangement can result in a specific layer combination inside a plasma processing apparatus. Due to functionality and space limitations of each fluid passage and layer, it is often not feasible to change geometries or space limitations. Hence, an interconnection sealer is needed to provide for adequate sealing. The slot geometry is constrained by four vacuum passages that couple the process chamber to the second fluid passage. The vacuum passages are used to collect fluid signals from the process chamber. Because of the size limitations of both the second fluid passage and the diameter of the four vacuum passages, the slot shape or some other elongated shape is needed so that the vacuum passages may connect to a non-curved portion of the fluid passage. On the other hand, the first fluid passage cannot have the slot shape to match the first fluid passage because the first fluid passage is required to seat a circular screw head in its pathway.

Figure 6:
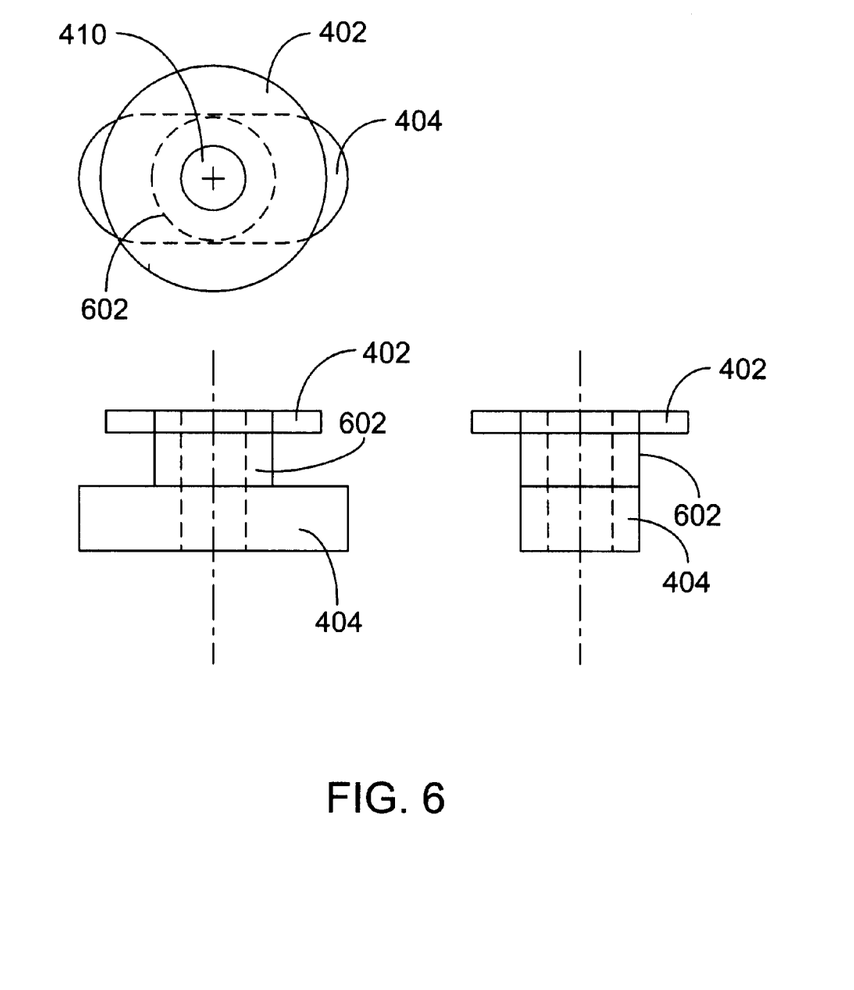
FIG. 6 illustrates, in accordance with one embodiment of the present invention, an interconnection sealer with a first geometry having an oval shape and a second geometry having a circular shape.

To facilitate discussion of this embodiment of the present invention, FIG. 6 shows a front, side and top view of interconnection sealer 400 with a first geometry having a circular shape and a second geometry having a slot shape. Interconnection sealer 400 includes first end 402 having the circle geometry and second end 404 having the slot geometry. Also included in interconnection sealer 400 is opening 410. Opening 410 is configured to allow fluid flow to pass from a first fluid passage to a second fluid passage. In this specific embodiment, the fluid flow is vacuum signals from the process chamber. As shown in FIG. 6, first end 402 is configured with a notch 602. In the manufacturing of plasma processing apparatus, it is difficult to align the first fluid passage with the second fluid passage. Therefore, interconnection sealer 400 is configured to include a seal for closing the gap between the fluid passage and the first end.

Figure 7:
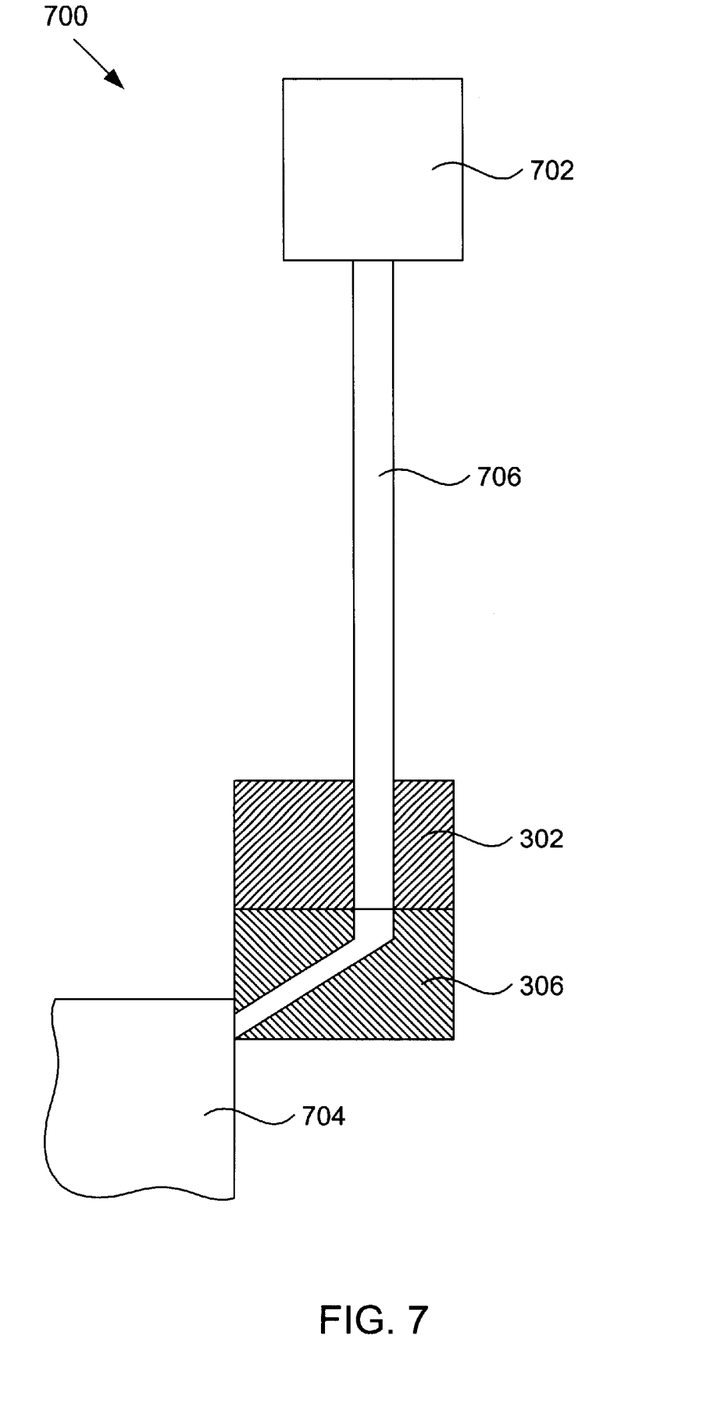
FIG. 7 illustrates an exemplary plasma processing apparatus that includes a manometer.

To point out this specific application of interconnection sealer 400, FIG. 7 illustrates an exemplary plasma processing apparatus 700. Plasma processing apparatus 700 includes a manometer 702 for measuring the pressure inside a process chamber 704. As shown, many layers, couplings and fluid passages exist between manometer 702 and process chamber 704. Two such layers are first layer 302 and second layer 306. Typically, first layer 302 is a clamp ring for clamping an upper electrode inside the plasma processing apparatus and second layer 306 is quartz ring for insulating the side walls (thereby confining a plasma) inside the plasma processing apparatus. Furthermore, a coupling 706 (e.g., another layer, tubing, fluid channel) connects first layer 302 to manometer 702.

Figure 8:
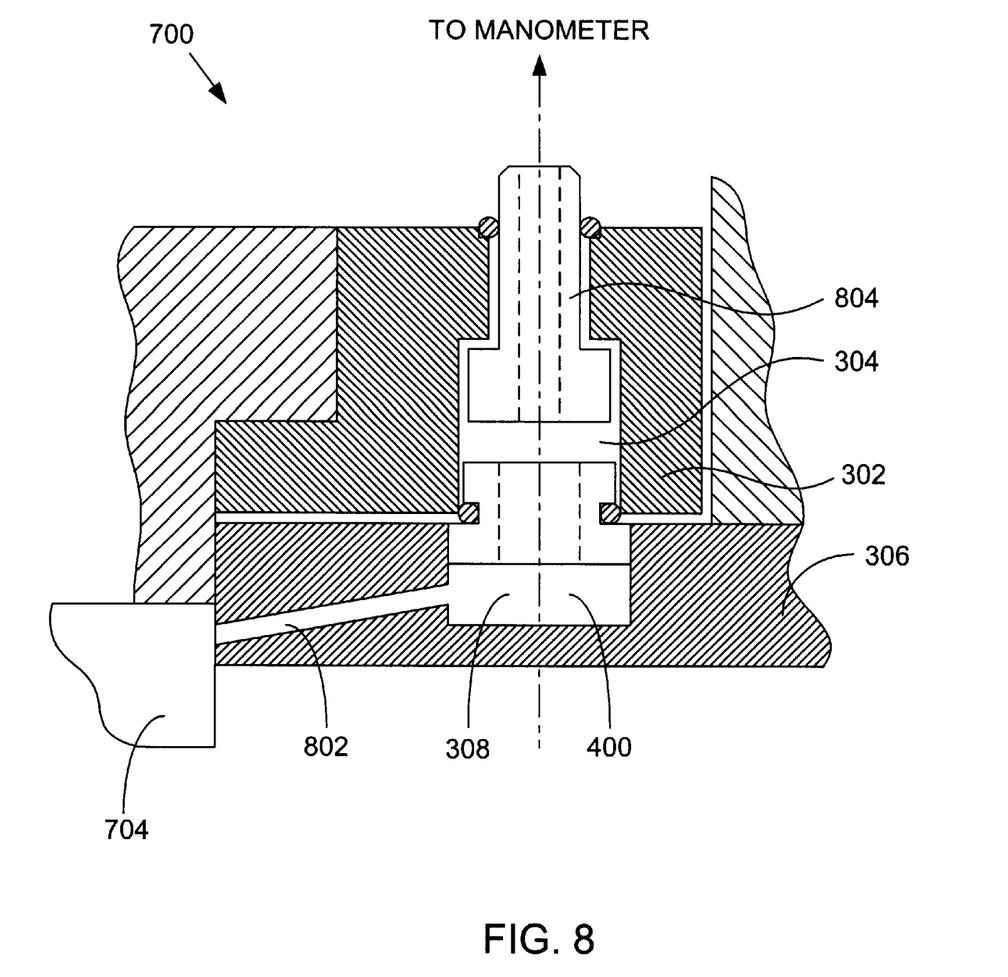
FIG. 8 illustrates, in accordance with one embodiment of the present invention, an interface of a first layer and a second layer as well as the surrounding area of the plasma processing apparatus.

FIG. 8 is a detailed cross-sectional view of the interface of first layer 302 and second layer 306 and the surrounding area of plasma processing apparatus 700. Interconnection sealer 400 is positioned in first fluid passage 304 of first layer 302 (i.e., clamp ring) and in second fluid passage 308 of second layer 306 (i.e., quartz ring). Basically, interconnection sealer 400 couples second fluid passage 308 to first fluid passage 304 creating a pathway for the collection of vacuum signals. As shown, interconnection sealer 400 is configured with a notch and a seal to fill the gap between the outer periphery of the first end of interconnection sealer 400 and first fluid passage 304. However, it should be noted that this is not a limitation and that any of the interconnection arrangements of discussed above may be used.

A vacuum fluid passage 802 is coupled between second fluid passage 308 and process chamber 704. Preferably, four vacuum fluid passages 802 are used to allow a fluid to pass from inside process chamber 704 to second fluid passage 308, while keeping a plasma substantially confined therein. However, this is not a limitation and any suitable configuration of chamber fluid passages 802 may be used. Furthermore, any change in the vacuum fluid passages arrangement will correspondingly change the geometric shape needed. Additionally, a screw head 804 is placed in a portion of first fluid passage 304. Screw head 804 includes an opening that couples first fluid passage 304 to the manometer (not shown). However, this is not a limitation and therefore screw head 804 may or may not be placed in fluid passage 304.

Accordingly, it is observed that the present invention substantially reduces leaks at the interface of two fluid passages. The present invention thus produces more consistent and accurate readings at a manometer. In fact, the addition of an interconnection sealer into one particular plasma processing apparatus eliminated a 20% error in the manometer readings. Advantageously, use of an interconnection sealer according to the invention overcomes design limitations such as fluid passages with complicated shapes, especially when used in areas with limited space. Furthermore, an interconnection sealer is a low cost device that may be used in existing designs (retrofittable) as well as new designs. It should also be noted that the interconnection sealer can have a wide range of sizes, from small to large, and is thus useful for sealing an interface of fluid passages of various sizes.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A fluid connector assembly for sealing an interface, said fluid connector assembly comprising:
   a first and second fluid passages in a plasma processing apparatus;
   a fluid connector having a first end member having a first cross sectional shape, the first cross sectional shape being arranged to seal a first mating region of the first fluid passage;
   said fluid connector having a second end member having a second cross sectional shape, the second cross sectional shape being arranged to seal a second mating region of the second fluid passage, the second cross sectional shape being different than the first cross sectional shape; and
   an opening that extends through said first end member and said second end member through which a fluid passes for use by the plasma processing apparatus so as to fluidly couple the first fluid passage to the second fluid passage.

2. A fluid connector assembly of claim 1, wherein the first cross sectional shape is a circle and the second cross sectional shape is a slot.

3. A fluid connector assembly of claim 1, wherein said fluid connector is formed from a deformable material that can seal an interface between said first end member and the first fluid passage.

4. A fluid connector assembly of claim 1, wherein said connector is formed from a material that can withstand a plasma environment provided by the plasma processing apparatus.

5. A fluid connector assembly of claim 4, wherein the material is deformable.

6. A fluid connector assembly of claim 5, wherein the material is polytetraflouroethylene.

7. A fluid connector assembly of claim 5, wherein the material is polyetheretherketone.

8. A fluid connector assembly of claim 1, wherein said fluid connector is configured to hold a first seal, said first seal being configured to further seal an interface between said first end member and said first fluid passage.

9. A fluid connector assembly of claim 8, herein said first seal is an o-ring.

10. A fluid connector assembly of claim 8, wherein said first seal is placed around an outer periphery of the said first end member.

11. A fluid connector assembly of claim 8, wherein the first seal is placed on a distal face of said first end member.

12. A fluid connector assembly of claim 8, wherein said fluid connector is configured to hold a second seal, said second seal being configured to further seal an interface between said second end member and said second fluid passage.

13. A fluid connector assembly of claim 8, wherein said fluid connector is configured to hold a second seal, said second seal being configured to further seal the interface between said first end member and said first fluid passage.

14. A fluid connector assembly of claim 1, wherein the first and second cross sectional shapes are selected from the group consisting essentially of a circle, square, oval, rectangle, triangle, polygon, or slot.

15. A fluid connector assembly of claim 1, wherein said plasma processing apparatus is used to process a semiconductor based product.

16. A fluid connector assembly of claim 1, wherein the first end has an outer periphery that is configured to fill an inner periphery of the first fluid passage, wherein the second end has an outer periphery that is configured to fill an inner periphery of the second fluid passage, whereby filling the first and second fluid passages seals the interface between the first and second fluid passages.

17. A fluid connector assembly of claim 1, wherein the opening fluidly couples the first passage to the second passage when the first end member is disposed inside the first fluid passage and when the second end member is disposed inside the second fluid passage.

18. A fluid connector assembly of claim 1, wherein the fluid is selected from the group comprising nitrogen, oxygen, argon, or $C_4F_8$.

19. A fluid connector assembly of claim 1, wherein only a fluid is allowed to pass through the opening.

20. A system for sealing an interface between at least two fluid passages, said system comprising:
    a first and second fluid passages of a plasma processing apparatus;
    a first surface including the first fluid passage, the first fluid passage having a first cross sectional shape;
    a second surface including the second fluid passage, the second fluid passage having a second cross sectional shape, the second cross sectional shape being different from the first cross sectional shape of the first fluid passage; and
    a connector sealing the first fluid passage with the second fluid passage, said connector including a proximal section and a distal section, the proximal section being configured to at least partially extend into the first fluid passage and having a shape that coincides with the first shape such that said connector is sealed with respect to the first fluid passage, the distal section being configured to at least partially extend into the second fluid passage and having a shape that coincides the second fluid passage, and said connector including an opening that provides a sealed fluid passage between the first fluid passage and the second fluid passage.

21. A system of claim 20, wherein the first fluid passage and the second fluid passage are vacuum passages.

22. A system of claim 20, wherein the first fluid passage is coupled to a manometer.

23. A system of claim 20, wherein the first shape geometry is a circular shape and the second shape is an oval shape.

24. A system of claim 20, wherein the first shape is a circular shape and the second shape is a slot.

25. A system of claim 20, wherein the connector is formed from a material that can seal an interface between said connector and the first fluid passage.

26. A system of claim 20, wherein said connector is formed from a material that can withstand a plasma environment provided by the plasma processing apparatus.

27. A system of claim 26, wherein the material is polytetraflouroethylene.

28. A system of claim 26, wherein the material is polyetheretherketone.

29. A system of claim 20, wherein said connector is configured to hold a seal, said seal being configured to further seal an interface between said first end member and said first fluid passage.

30. A system of claim 29, wherein said seal is an o-ring.

31. A system of claim 29, wherein said seal is placed around an outer periphery of the said first end member.

32. A system of claim 20, wherein the first and second fluid passages are vacuum passages.

33. A fluid connector assembly for sealing an interface, said fluid connector assembly comprising:
   a first and second fluid passages in a semiconductor processing apparatus;
   a fluid connector having a first end member having a first cross sectional shape, the a first cross sectional shape being arranged to seal a first mating region of the first fluid passage;
   said fluid connector having a second end member having a second cross sectional shape, the second cross sectional shape being arranged to seal a second mating region of the second fluid passage, the second cross sectional shape being different than the first cross sectional shape; and
   an opening that extends through said first end member and said second end member through which a fluid passes for use by the plasma processing apparatus so as to fluidly couple the first fluid passage to the second fluid passage,
   wherein said fluid connector is configured to hold a first seal, said first seal being configured to further seal an interface between said first end member and said first fluid passage, and wherein said fluid connector is configured to hold a second seal, said second seal being configured to further seal an interface between said second end member and said second fluid passage.

34. A system for sealing an interface between at least two fluid passages, said system comprising:
   a first and second fluid passages of a plasma-processing apparatus;
   a first surface including the first fluid passage, the first fluid passage having a circular shape;
   a second surface including the second fluid passage, the second fluid passage having an oval shape; and
   a connector sealing the first fluid passage with the second fluid passage, said connector including a proximal section and a distal section, the proximal section being configured to at least partially extend into the first fluid passage and having a shape that coincides with the circular shape such that said connector is sealed with respect to the first fluid passage, the distal section being configured to at least partially extend into the second fluid passage and having a shape that coincides with the oval shape such that said connector is sealed with respect to the second fluid passage, and said connector including an opening that provides a sealed fluid passage between the first fluid passage and the second fluid passage.

35. A fluid connector assembly for fluidly coupling a first passage of a first component with a second passage of a second component, said first and second passages being configured for passing a fluid therethrough, said fluid connector assembly comprising:
   the first and the second fluid passages are of a plasma processing apparatus;
   a fluid connector having a sealing member having a first end to be inserted into said first passage so as to seal said first passage and a second member to be inserted into said second passage so as to seal said second passage, said second member being positioned opposite said first member, said connecting member including a fluid passage that extends through the first and second ends so as to allow a fluid to pass therethrough, each of said ends having a cross section defined by an imaginary plane that intersects the fluid passage, said first end having a first cross sectional shape that is different than a second cross sectional shape of said second end.

36. A fluid connector assembly of claim 35, wherein the first and second cross sectional shapes are selected from the group consisting essentially of a circle, square, oval, rectangle, triangle, polygon, or slot.

37. A fluid connector assembly of claim 36, wherein the first cross sectional shape corresponds to a circle, and wherein the second cross sectional shape corresponds to a polygon.

38. A fluid connector assembly of claim 36, wherein the first cross sectional shape corresponds to a first polygon, and wherein the second cross sectional shape corresponds to a second polygon.

39. A fluid connector assembly of claim 35, wherein a substantial portion of said first end extends into said first opening, and wherein a substantial portion of said second end extends into said second opening when said first and second ends are inserted into said first and second openings.

40. A fluid connector assembly of claim 35, wherein said connector further includes a seal disposed around an outer periphery of said first end.

41. A fluid connector assembly of claim 35, wherein said connector further includes a seal disposed on the outer face of said first end.

42. A fluid connector assembly of claim 35, wherein said connector further includes a first seal disposed around an outer periphery of said first end and a second seal disposed around an outer periphery of said second end.

43. A fluid connector assembly of claim 35, wherein said connector further includes a plurality of seals disposed around an outer periphery of said first end.

44. A fluid connector assembly of claim 35, wherein said fluid is associated with plasma processing.

45. A fluid connector assembly of claim 35, wherein said fluid passage is a vacuum passage.

46. A fluid connector assembly of claim 35, wherein the fluid is a gas.

47. A fluid connector assembly of claim 35, wherein the fluid is a liquid.

48. A plasma processing apparatus, comprising:
   a chamber associated with a first fluid passage;
   a manometer associated with a second fluid passage; and
   an interconnection sealer sealing an interface between the first fluid passage and the second fluid passage, said interconnection sealer including:
     a first end member having a first cross sectional shape, the first cross sectional shape being arranged to seal a first mating region of the first fluid passage;
     a second end member having a second cross sectional shape, the second cross sectional shape being arranged to seal a second mating region of the second fluid passage, the second cross sectional shape being different than the first cross sectional shape; and an opening that extends through said first end member and said second end member through which a fluid passes so as to fluidly couple the first fluid passage to the second fluid passage.

49. A plasma processing apparatus of claim 48, wherein the first and second fluid passages are dedicated to measuring a pressure with said manometer.

50. A plasma processing apparatus of claim wherein 48, the first and second fluid passages are used to collect fluid signals from the process chamber.

51. A plasma processing apparatus, comprising:

a process chamber having a first fluid passage and a second fluid passage;

a first layer having the first fluid passage extending therethrough, the first fluid passage having a first end, which is exposed to said process chamber and which is defined by one or more first openings, a second end which is defined by a second opening and the first opening having a cross sectional shape;

a second layer having the second fluid passage extending therethrough; the second fluid passage having a third opening, the third opening having a different cross sectional shape than the cross sectional shape of said first opening;

an interconnection sealer having a first end member disposed inside said second opening, a second end member disposed inside said third opening, and a third fluid passage extending through the first and second end members, the first end member having an outer periphery that is configured to fit an inner periphery of the second opening, the second end member having an outer periphery that is configured to fit an inner periphery of the third opening, whereby the interconnection sealer seals the first and second fluid passages seals the interface between the second and third opening, the third fluid passage being configured to allow a fluid to pass from the first fluid passage to the second fluid passage.

52. A plasma processing apparatus of claim 51 further including a coupling that is connected to the second fluid passage and a manometer, the coupling being configured to allow a fluid to pass from the second fluid passage to the manometer so as to allow the manometer to read a pressure inside said process chamber.

* * * * *